United States Patent
Mori (10) Patent No.: US 9,769,944 B2
(45) Date of Patent: Sep. 19, 2017

(54) SEMICONDUCTOR MEMORY DEVICE (71) Applicant: Toshiba Memory Corporation, Minato-ku (JP)

(72) Inventor: Itaru Mori, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/050,865

(22) Filed: Feb. 23, 2016

(65) Prior Publication Data

US 2017/0018895 A1    Jan. 19, 2017

Related U.S. Application Data

(60) Provisional application No. 62/192,864, filed on Jul. 15, 2015.

(51) Int. Cl.
| | |
|---|---|
| *H01R 24/00* | (2011.01) |
| *H01R 12/00* | (2006.01) |
| *H05K 5/02* | (2006.01) |
| *H05K 5/00* | (2006.01) |

(52) U.S. Cl.
CPC ......... *H05K 5/0278* (2013.01); *H05K 5/0056* (2013.01)

(58) Field of Classification Search
CPC .. H01R 12/722; H01R 24/00; H01R 13/6658; H01R 31/06; H01R 12/721; H01R 27/00; H01R 2201/06; H01R 12/725; H01R 13/665

USPC ................................. 439/660, 76.1
See application file for complete search history.

(56) References Cited

U.S. PATENT DOCUMENTS

| | | | | |
|---|---|---|---|---|
| 7,040,919 B2 * | 5/2006 | Yao | ........................ | H01R 29/00 439/502 |
| 7,247,057 B2 * | 7/2007 | Matsuo | .................. | H05K 1/117 439/660 |
| 8,215,991 B2 * | 7/2012 | Bryant-Rich | ........ | G06K 7/0021 439/607.22 |
| 8,555,496 B2 * | 10/2013 | Moutel | .................. | G06K 19/04 29/829 |
| 9,153,926 B2 * | 10/2015 | Wu | ..................... | H01R 13/6585 |

FOREIGN PATENT DOCUMENTS

| | | |
|---|---|---|
| JP | 2013-93433 | 5/2013 |
| JP | 2013-242976 | 12/2013 |

* cited by examiner

*Primary Examiner* — Xuong Chung Trans
(74) *Attorney, Agent, or Firm* — Oblon, McClelland, Maier & Neustadt, L.L.P.

(57) ABSTRACT

According to one embodiment, a semiconductor memory device includes a conductor layer including a first terminal, and a first insulating layer including a first opening. The first opening includes a first edge and a second edge, a distance between the second edge and the first terminal being larger than a distance between the first edge and the first terminal.

12 Claims, 10 Drawing Sheets

SEMICONDUCTOR MEMORY DEVICE

CROSS-REFERENCE TO RELATED APPLICATIONS

This application is based upon and claims the benefit of priority from U.S. Provisional Application No. 62/192,864, filed on Jul. 15, 2015; the entire contents of which are incorporated herein by reference.

FIELD

Embodiments described herein relate generally to a semiconductor memory device.

BACKGROUND

For example, a semiconductor memory device, such as a USB flash drive, includes a connection terminal for connection to a host. When the connection terminal of a plug is electrically connected to the connection terminal of a receptacle, the semiconductor memory device is connected to the host.

DETAILED DESCRIPTION

In general, according to one embodiment, a semiconductor memory device is provided, the semiconductor memory device including a substrate including a main surface and an end surface adjacent to the main surface; a conductor layer including a first terminal mounted on the main surface and extended toward the end surface; and a first insulating layer mounted on the main surface and covering a part of the conductor layer, the first insulating layer including a first opening that exposes at least part of the first terminal, wherein the first opening includes a first edge separated from the first terminal in a first direction in which the first terminal is extended, and a second edge separated from the first terminal in a second direction perpendicular to the first direction, a distance between the second edge and the first terminal in the second direction being larger than a distance between the first edge and the first terminal.

Exemplary embodiments of a semiconductor memory device will be explained below in detail with reference to the accompanying drawings. The present invention is not limited to the following embodiments.

First Embodiment

Next, an explanation will be given of a first embodiment with reference to FIGS. 1 to 5. Hereinafter, there is a case that a plurality of representations are mentioned together, in terms of a constituent element according to each embodiment and a description on the element. Such a constituent element and its description should be construed without prejudice to use of another representation unmentioned for the same. Further, a constituent element and its description, unaccompanied by a plurality of representations, should be construed without prejudice to use of another representation for the same.

Figure 1:
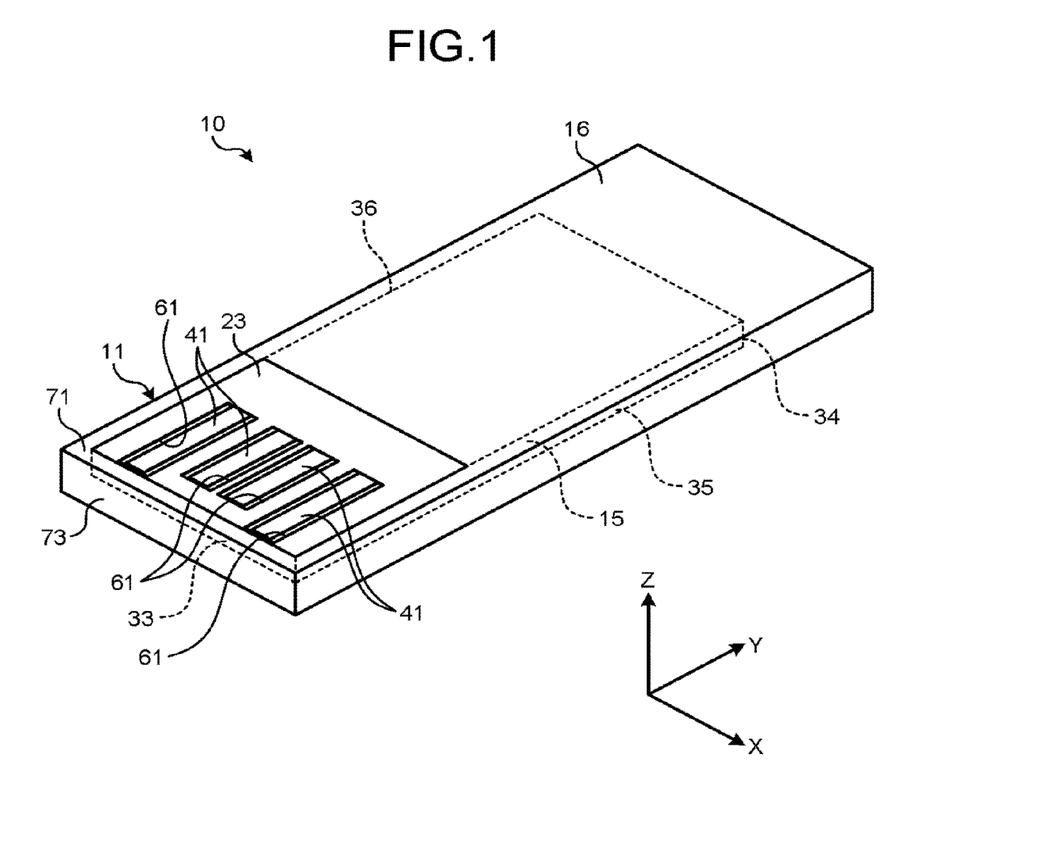
FIG. 1 is a perspective view showing a USB drive according to a first embodiment.

FIG. 1 is a perspective view showing a USB flash drive (which will be referred to as a USB drive, hereinafter) 10 according to the first embodiment. The USB drive 10 is an example of a semiconductor memory device, and may also be called an electronic device, external device, external memory device, or auxiliary memory device, for example.

The USB drive 10 is configured to be connected to a personal computer serving as a host, for example. When the USB drive 10 is connected to the host, it is utilized as an auxiliary memory device of the host. However, the semiconductor memory device is not limited to such a USB drive 10, but may be another device.

As shown in FIG. 1, the USB drive 10 includes a Universal Serial Buss (USB) connector 11. The USB connector 11 is a portion of the USB drive 10 to be inserted into the host.

The USB connector 11 is provided at an end portion of the USB drive 10, for example. The USB connector 11 is formed in a substantially quadrilateral shape. However, the USB connector 11 may be formed in another shape.

As shown in the drawings, an X-axis, a Y-axis, and a Z-axis are defined in this specification. The X-axis, Y-axis, and Z-axis are perpendicular to each other. The X-axis extends along the width of the USB connector 11. The Y-axis extends along the length of the USB connector 11. The Z-axis extends along the thickness of the USB connector 11.

The USB drive 10 includes a circuit board 15 and a cover 16. The circuit board 15 is a printed circuit board (PCB), for example. However, the circuit board 15 may be another circuit board. The cover 16 is made of, e.g., a synthetic resin, and covers part of the circuit board 15.

Figure 2:
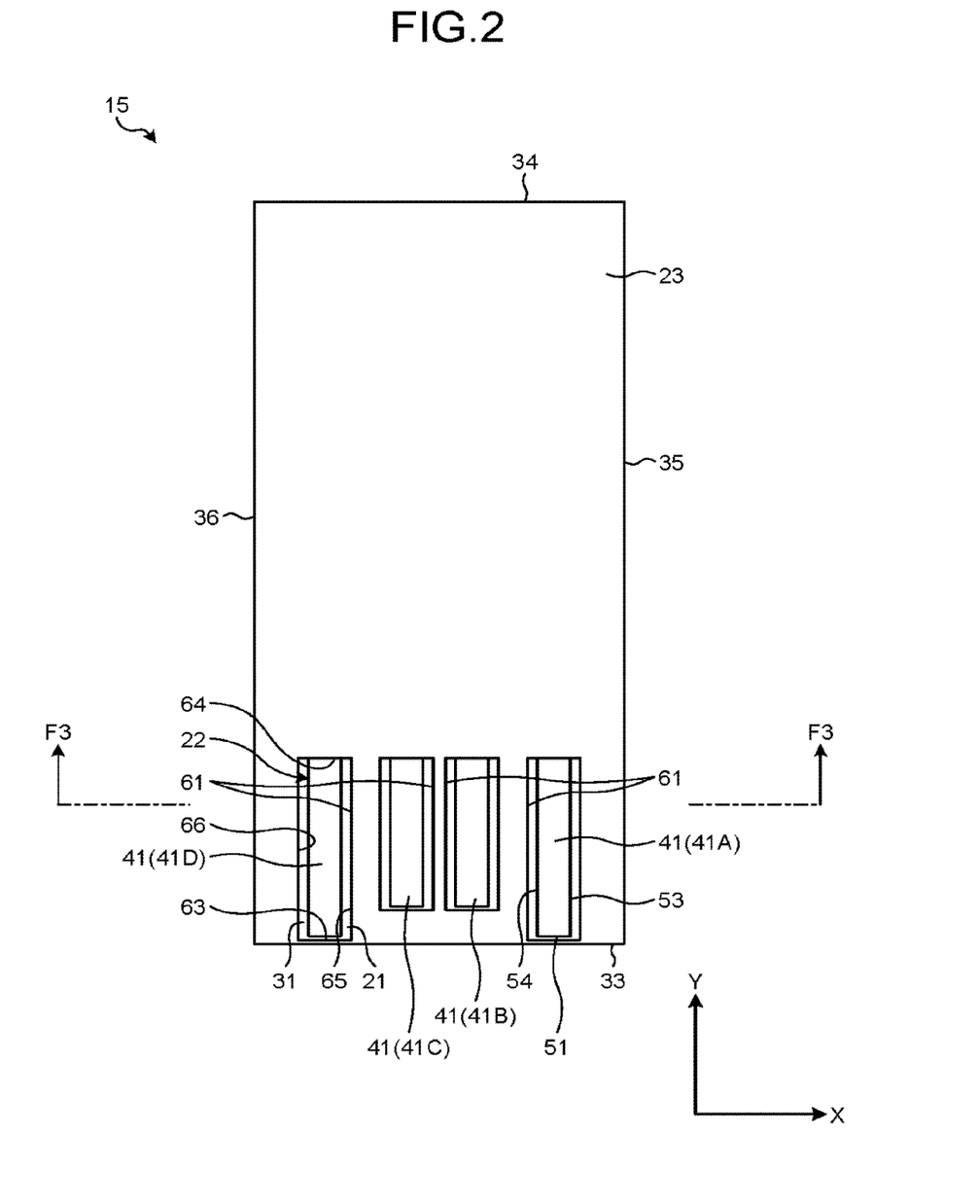
FIG. 2 is a plan view showing a circuit board according to the first embodiment.
Figure 3:
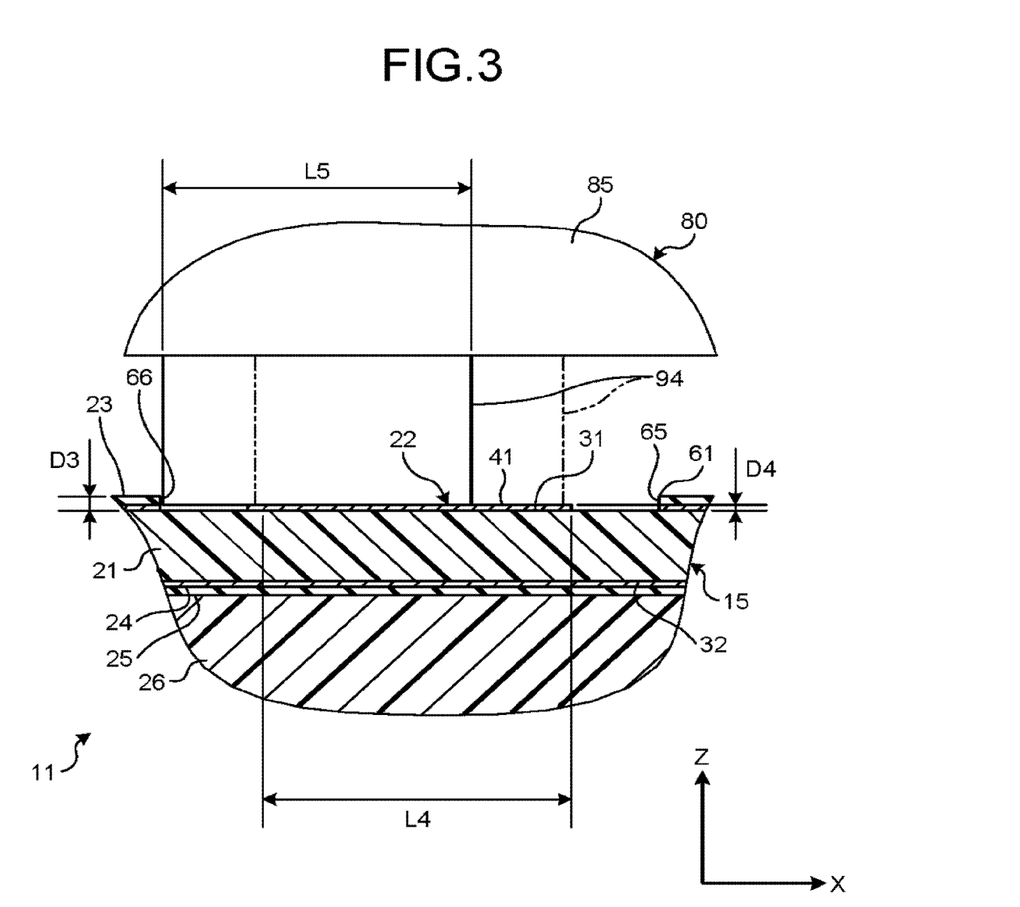
FIG. 3 is a sectional view showing part of a USB connector according to the first embodiment.

FIG. 2 is a plan view showing the circuit board 15 according to the first embodiment. FIG. 3 is a sectional view showing part of the USB connector 11 according to the first embodiment, at a position taken along a line F3-F3 of FIG. 2. FIG. 3 further shows part of a receptacle 80 described later, for the sake of explanation. As shown in FIG. 3, the circuit board 15 includes a substrate 21, a first conductor layer 22, a first solder resist 23, a second conductor layer 24, a second older resist 25, and a reinforcing plate 26. The substrate 21 may also be called a base, core, or prepreg, for example. The first conductor layer 22 is an example of a conductor layer, and may also be called a conductor, wiring, or circuit, for example. The first solder resist 23 is an example of a first insulating layer, and may also be called an insulator, protecting portion, or covering portion, for example.

The substrate 21 is the core material of the circuit board 15, and is made from a glass cloth and a resin, for example. As shown in FIG. 2, the substrate 21 according to this embodiment is formed as a plate having a substantially rectangular shape extending in a direction along the Y-axis. The substrate 21 includes a first main surface 31, a second main surface 32 shown in FIG. 3, a first end surface 33, a second end surface 34, a third end surface 35, and a fourth end surface 36. The first main surface 31 is an example of a main surface, and may also be called a mount face, surface, or face, for example. The first end surface 33 is an example of an end surface, and may also be called an end portion or edge, for example.

The first main surface 31 is one of the surfaces of the substrate 21 formed in a substantially flat state. The first main surface 31 faces in a direction along the Z-axis. The second main surface 32 shown in FIG. 3 is positioned opposite to the first main surface 31.

Each of the first to fourth end surfaces 33 to 36 is a face adjacent to the first main surface 31. The first to fourth end surfaces 33 to 36 are orthogonal to (intersectional with) the first main surface 31, but this is not limiting. The first end surface 33 is one of the end surfaces of the substrate 21 in the lengthwise direction, and faces in the direction along the Y-axis. The second end surface 34 is the other end surface of the substrate 21 in the lengthwise direction, and is positioned opposite to the first end surface 33. The third end surface 35 is one of the end surfaces of the substrate 21 in the widthwise direction, and faces in a direction along the X-axis. The fourth end surface 36 is the other end surface of the substrate 21 in the widthwise direction, and is positioned opposite to the third end surface 35.

Figure 4:
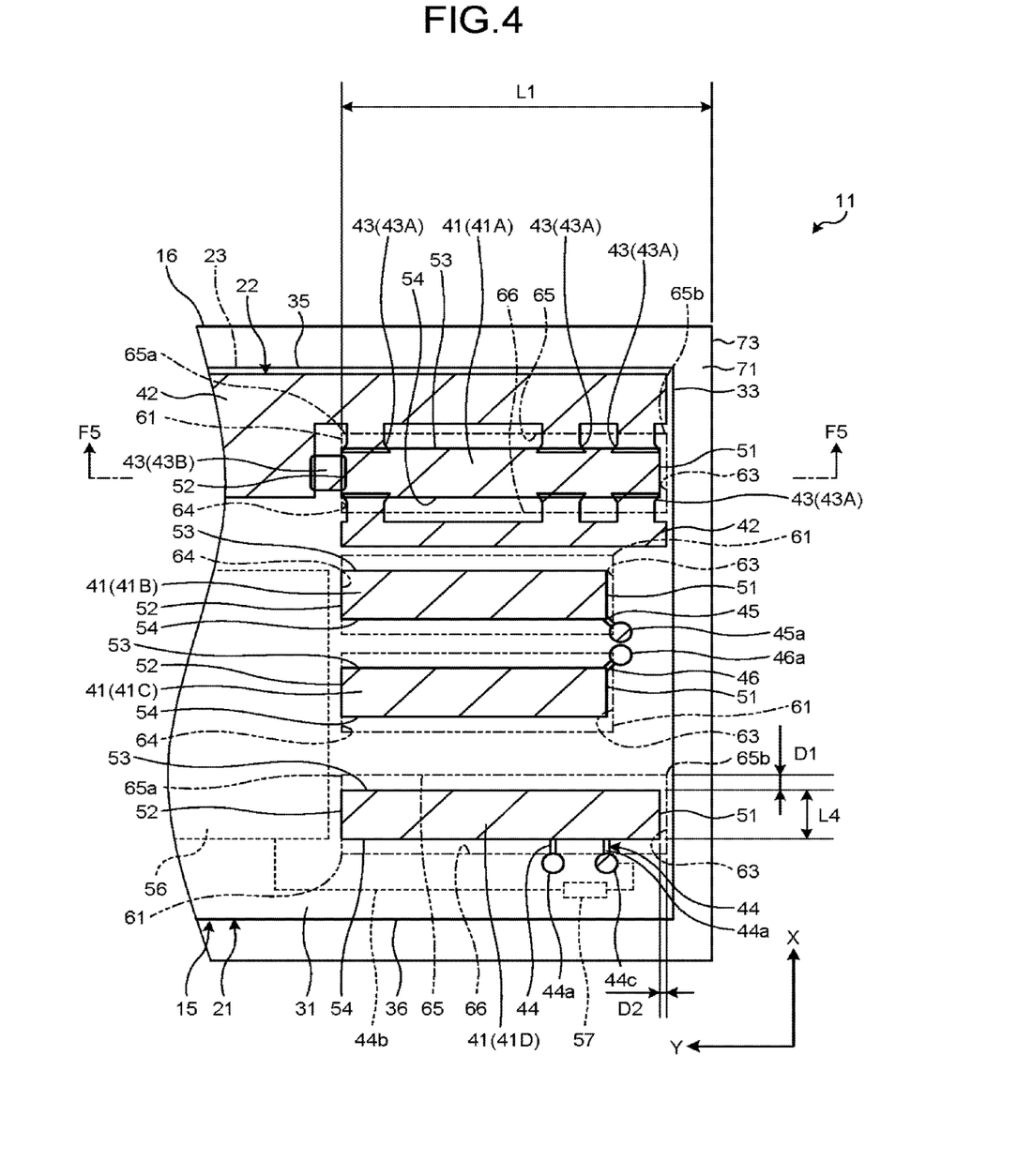
FIG. 4 is a plan view showing part of the USB connector according to the first embodiment.

FIG. 4 is a plan view showing part of the USB connector 11 according to the first embodiment. FIG. 4 shows the first solder resist 23 by use of two-dot chain lines. In FIG. 4, the first conductor layer 22 is shown with hatching. As shown in FIG. 4, the first conductor layer 22 is mounted on the first main surface 31 of the substrate 21. The first conductor layer 22 is made of copper, for example. However, the first conductor layer 22 may be made of another material.

The first conductor layer 22 includes four terminals 41, a plurality of ground layers 42, a plurality of ground wirings 43, a plurality of power wirings 44, a first communication wiring 45, and a second communication wiring 46. Each terminal 41 may also be called a connecting portion, for example. Each ground wiring 43 is an example of a first or second wiring. Each power wiring 44 is an example of a third wiring.

The four terminals 41 are mounted near the first end surface 33. Each of the four terminals 41 is extended toward the first end surface 33 in the direction along the Y-axis. The direction along the Y-axis is an example of a first direction. The four terminals 41 are extended substantially in parallel with each other.

Each of the four terminals 41 is formed of a copper foil formed on the first main surface 31, a nickel layer covering the copper foil, and a gold-nickel layer plated on the nickel layer, for example. In other words, the terminals 41 are plated.

When the first main surface 31 of the substrate 21 is seen in a plan view, each terminal 41 according to this embodiment is formed in a substantially rectangular shape extended in the direction along the Y-axis. However, each terminal 41 may be formed in another shape. Each terminal 41 has two end edges 51 and 52 and two side edges 53 and 54. Each of the end edges 51 and 52 may also be called a short side, for example. Each of the side edges 53 and 54 may also be called a long side, for example.

The two end edges 51 and 52 respectively are extended in the direction along the X-axis. The two side edges 53 and 54 respectively are extended in the direction along the Y-axis.

The one end edge 51 is closer to the first end surface 33 of the substrate 21 than the other end edge 52 is. The one side edge 53 is closer to the third end surface 35 of the substrate 21 than the other side edge 54 is.

The four terminals 41 are arrayed in the direction along the X-axis. The direction along the X-axis is an example of a second direction. The four terminals 41 include a ground terminal 41A, a first communication terminal 41B, a second communication terminal 41C, and a power terminal 41D. The ground terminal 41A is an example of a first terminal. Each of the first and second communication terminals 41B and 41C is an example of a third terminal. The power terminal 41D is an example second terminal.

The ground terminal 41A is arranged at one end of the four terminals 41. The power terminal 41D is arranged at the other end of the four terminals 41. The ground terminal 41A is closer to the third end surface 35 of the substrate 21 than the power terminal 41D is.

The first communication terminal 41B and the second communication terminal 41C are arranged between the ground terminal 41A and the power terminal 41D. The first communication terminal 41B is closer to the third end surface 35 of the substrate 21 than the second communication terminal 41C is. Accordingly, the ground terminal 41A is adjacent only to the first communication terminal 41B. Further, the power terminal 41D is adjacent only to the second communication terminal 41C.

In the direction along the Y-axis, the length of the ground terminal 41A and the length of the power terminal 41D are substantially equal to each other. In the direction along the Y-axis, the length of the first communication terminal 41B and the length of the second communication terminal 41C are substantially equal to each other. The length of each of the ground terminal 41A and the power terminal 41D is larger than the length of each of the first communication terminal 41B and the second communication terminal 41C.

The respective ground wirings 43 connect the ground terminal 41A to the respective ground layers 42. The ground wirings 43 includes a plurality of first ground wirings 43A and a second ground wiring 43B. Each first ground wiring 43A is an example of a first wiring. The second ground wiring 43B is an example of a second wiring.

The plurality of first ground wirings 43A respectively are extended in the direction along the X-axis from the two side edges 53 and 54 of the ground terminal 41A. In other words, the first ground wirings 43A are extended in a direction intersecting with the direction in which the ground terminal 41A is extended (the direction along the Y-axis). However, each first ground wiring 43A may be extended in a direction obliquely intersecting with the direction in which the ground terminal 41A is extended, for example.

The second ground wiring 43B is extended in the direction along the Y-axis from the end edge 52, which is one of the two end edges 51 and 52 more distant from the first end surface 33. In other words, the second ground wiring 43B is extended in a direction of getting away from the first end surface 33.

One of the ground layers 42 is disposed between the ground terminal 41A and the third end face 35 of the substrate 21. Some of the first ground wirings 43A and the second ground wiring 43B connect this one of the ground layers 42 to the ground terminal 41A.

The other one of the ground layers 42 is disposed between the ground terminal 41A and the first communication terminal 41B. The other first ground wirings 43A connect the other one of the ground layers 42 to the ground terminal 41A.

On the substrate 21, a controller 56 and a fuse 57 are mounted. The controller 56 is an example of an electronic component. The controller 56 and the fuse 57 are mounted on the second main surface 32, for example. Accordingly, FIG. 4 shows the controller 56 and the fuse 57 by use of broken lines.

The controller 56 is electrically connected to a plurality of nonvolatile memories mounted on the circuit board 15, for example. The nonvolatile memories are NAND type flash memories, for example. The controller 56 is configured to control these nonvolatile memories.

The power wirings 44 connect the power terminal 41D to the controller 56. The power wirings 44 are extended in the direction along the X-axis from the side edge 54, which is one of the two side edges 53 and 54 closer to the fourth end surface 36. In other words, the power wirings 44 are extended in a direction of getting away from the other terminals 41A to 41C.

The power wirings 44 include first wiring portion 44a and a second wiring portion 44b. The first wiring portion 44a is an example of a fourth wiring. The second wiring portion 44b is an example of a fifth wiring. The first wiring portion 44a is extended from the power terminal 41D through a via 44c to the second main surface 32, and is connected to the fuse 57. In other words, the first wiring portion 44a electrically connect the power terminal 41D and the fuse 57. The second wiring portion 44b electrically connects the fuse 57 and the controller 56.

The fuse 57 is intermediate between the power terminal 41D and the controller 56 in the power wirings 44. The fuse 57 is arranged between the power terminal 41D and the fourth end surface 36, when seen in a plan view.

The USB drive 10 is supplied with electric power from the host through the power terminal 41D. If the voltage supplied from the host is higher than a predetermined value, the fuse 57 is blown out, so that the controller 56 is protected.

The first communication wiring 45 is extended from the corner between the end edge 51 and side edge 54 of the first communication terminal 41B in an oblique direction. The first communication wiring 45 is extended from the first communication terminal 41B in a direction of getting away from the controller 56, when seen in a plan view. The first communication wiring 45 is connected to the controller 56 through a via 45a.

The second communication wiring 46 extended from the corner between the end edge 51 and side edge 53 of the second communication terminal 41C in an oblique direction. The second communication wiring 46 is extended from the second communication terminal 41C in a direction of getting away from the controller 56, when seen in a plan view. The second communication wiring 46 is connected to the controller 56 through a via 46a.

Each ground wiring 43 is thicker than each power wiring 44. Further, each ground wiring 43 is thicker than the first communication wiring 45, and is thicker than the second communication wiring 46.

The first solder resist 23 is made of a synthetic resin, for example. However, the first solder resist may be made of another insulative material. The first solder resist 23 is provided on the first main surface 31 such that it covers part of the first conductor layer 22.

The first solder resist 23 is provided with four openings 61. Each opening 61 is an example of a first opening, and may also be called a hole or exposing portion, for example. The four openings 61 respectively correspond to the four terminals 41, and are provided near the first end surface 33. The four openings 61 respectively are extended in the direction along the Y-axis, toward the first end surface 33. The four openings 61 are extended substantially in parallel with each other.

When the first main surface 31 of the substrate 21 is seen in a plan view, each opening 61 according to this embodiment is formed in a substantially rectangular shape extending in the direction along the Y-axis. However, each opening 61 may be formed in another shape.

Each of the four openings 61 exposes part of the corresponding terminal 41 and part of the first main surface 31 positioned around this terminal 41. However, each opening 61 may expose the entirety of the corresponding terminal 41.

Each of the four openings 61 includes a first edge portion 63, a second edge portion 64, a third edge portion 65, and a fourth edge portion 66. The first edge portion 63 is an example of a first edge, and may also be called a short side, for example. Each of the third edge portion 65 and the fourth edge portion 66 is an example of a second edge, and may also be called a long side, for example. Each of the first to fourth edge portions 63 to 66 respectively forms a portion of each opening 61.

The first and second edge portions 63 and 64 respectively are extended in the direction along the X-axis. The third and fourth edge portions 65 and 66 respectively are extended in the direction along the Y-axis. The first edge portion 63 is closer to the first end surface 33 of the substrate 21 than the second edge portion 64 is. The third edge portion 65 is closer to the third end surface 35 of the substrate 21 than the fourth edge portion 66 is.

The first edge portion 63 is separated from the corresponding terminal 41 in the direction along the Y-axis. In other words, a gap is formed between the first edge portion 63 and the end edge 51 of the corresponding terminal 41. For example, in the direction along the Y-axis, the first edge portion 63 separated from the end edge 51 of the ground terminal 41A. The second edge portion 64 is arranged at substantially the same position as the end edge 52 of the corresponding terminal 41 in the direction along the Y-axis. However, the second edge portion 64 may be arranged across the corresponding terminal 41, or may be separated from the corresponding terminal 41, when seen in a plan view.

Since the second edge portion 64 is formed as described above, the end edge 5 of the ground terminal 41A is covered with the first solder resist 23. Thus, the second ground wiring 43B is extended from part of the ground terminal 41A covered with the first solder resist 23.

The third edge portion 65 is separated from the corresponding terminal 41 in the direction along the X-axis. In other words, a gap is formed between the third edge portion 65 and the side edge 53 of the corresponding terminal 41. For example, in the direction along the X-axis, the third edge portion 65 is separated from the side edge 53 of the ground terminal 41A. The third edge portion 65 faces the side edge 53.

The fourth edge portion 66 is separated from the corresponding terminal 41 in the direction along the X-axis. In other words, a gap is formed between the fourth edge portion 66 and the side edge 54 of the corresponding terminal 41. The fourth edge portion 66 faces the side edge 54.

As shown in FIG. 4, the distance D1 between the side edge 53 of the terminal 41 and the third edge portion 65 in the direction along the X-axis is larger than the distance D2 between the end edge 51 of this terminal 41 and the first edge portion 63 in the direction along the Y-axis. A distance between the side edge 54 of this terminal 41 and the fourth edge portion 66 is substantially the same as the distance D1.

Accordingly, the distance between the side edge 54 of this terminal 41 and the fourth edge portion in the direction along the X-axis is also larger than the distance D2 between the end edge 51 of this terminal 41 and the first edge portion 63 in the direction along the Y-axis.

The opening 61 that exposes the ground terminal 41A also exposes part of the first ground wirings 43A. The part of the first ground wirings 43A exposed by this opening 61 may be plated as in the terminals 41.

The openings 61 that respectively expose the first and second communication terminals 41B and 41C also expose part of the first and second communication wirings 45 and 46. The part of the first and second communication wirings 45 and 46 exposed by these openings 61 may be plated as in the terminals 41.

The opening 61 that exposes the power terminal 41D also exposes part of the power wirings 44. The part of the power wirings 44 exposed by this opening 61 may be plated as in the terminals 41.

As shown in FIG. 3, in the direction along the Z-axis, the distance D3 between the surface of the first solder resist 23 and the first main surface 31 of the substrate 21 is larger than a distance D4 between the surface of each terminal 41 and the first main surface 31. The direction along the Z-axis is an example of a thickness direction of the substrate. In other words, the terminals 41 are arranged in a recessed state from the first solder resist 23.

The second conductor layer 24 is mounted on the second main surface 32 of the substrate 21. The second conductor layer 24 is made of copper, for example. However, the second conductor layer 24 may be made of another material. The second conductor layer 24 forms part of each of the ground layers 42, power wirings 44, first communication wiring 45, and second communication wiring 46 provided on the second main surface 32, for example.

The second solder resist 25 is made of a synthetic resin, for example. However, the second solder resist 25 may be made of another insulative material. The second solder resist 25 is mounted on the second main surface 32 such that it covers at least part of the second conductor layer 24.

The reinforcing plate 26 is attached to the second solder resist 25 of the circuit board 15. The reinforcing plate 26 is made of a synthetic resin, for example. The reinforcing plate 26 reinforces the circuit board 15. However, the USB connector 11 may not include the reinforcing plate 26.

As shown in FIG. 4, the cover 16 includes a frame part 71. The frame part 71 surrounds the first to fourth end surfaces 33 to 36 of the substrate 21. The frame part 71 forms the front end portion 73 of the USB connector 11. The front end portion 73 is one of the end portions of the USB connector 11 in the direction along the Y-axis. The front end portion 73 faces in the substantially same direction as the first end surface 33 of the substrate 21.

The third edge portion 65 of each opening 61 includes a first end portion 65a and a second end portion 65b. The first end portion 65a is an example of a third end portion, which is one of the end portions of the third edge portion 65 in the direction along the Y-axis. The second end portion 65b is an example of the fourth end portion, which is the other of the end portions of the third edge portion 65 in the direction along the Y-axis, and is positioned opposite to the first end portion 65a. The second end portion 65b is closer to the front end portion 73 than the first end portion 65a is. In other words, the first end portion 65a is an end portion of the third edge portion 65 in a direction of being more distant from the front end portion 73 in the direction along the Y-axis. Further, the second end portion 65b is an end portion of the third edge portion 65 in a direction of being closer to the front end portion 73 in the direction along the Y-axis.

In the direction along the Y-axis, the length L1 between the front end portion 73 and the first end portion 65a of the third edge portion 65 is larger than 6.15 mm. Further, the length between the front end portion 73 and the end edge 52 of each terminal 41 is larger than 6.15 mm.

Figure 5:
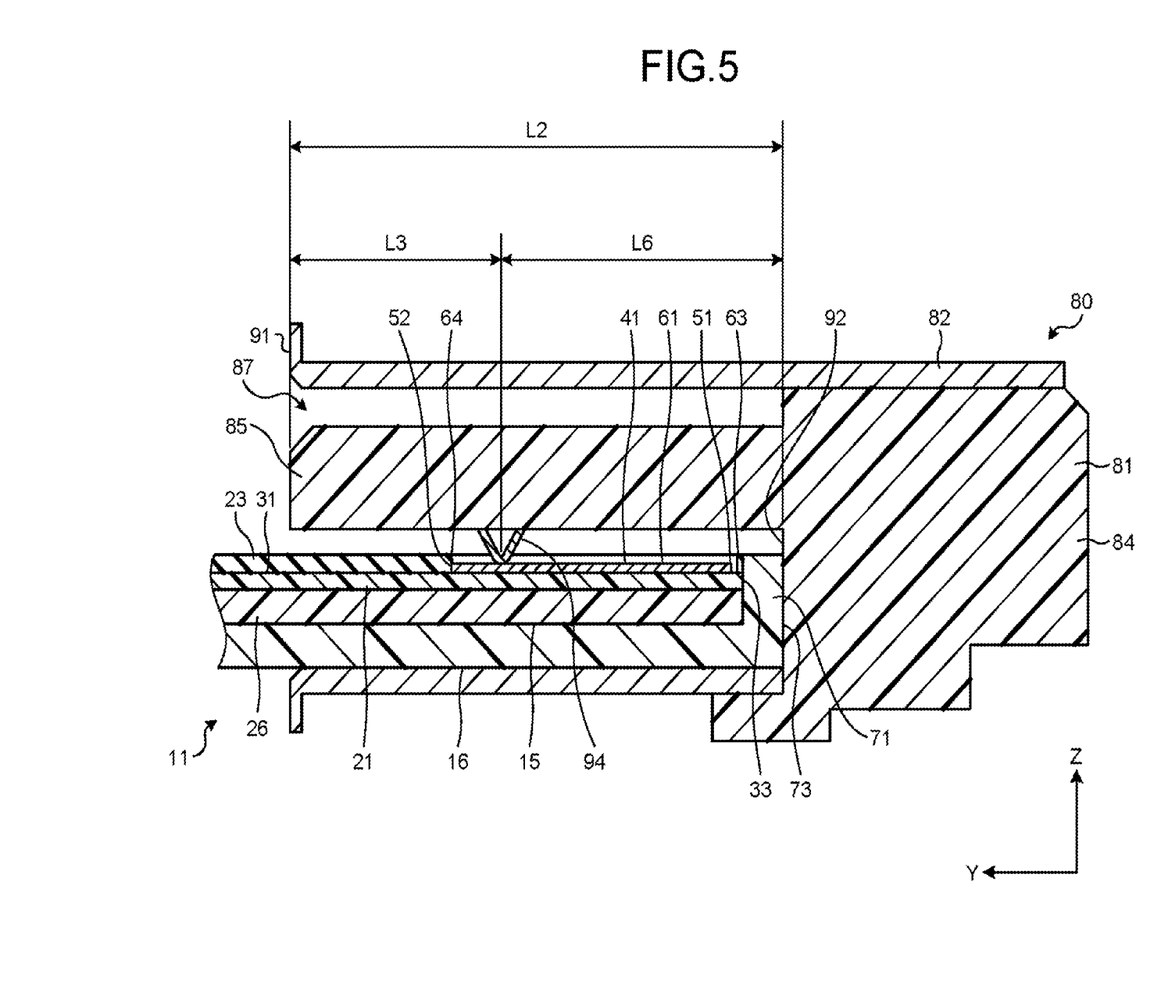
FIG. 5 is a sectional view showing the USB connector and a receptacle according to the first embodiment.

FIG. 5 is a sectional view showing the USB connector 11 and the receptacle 80 according to the first embodiment, at a position taken along a line F5-F5 of FIG. 4. As shown in FIG. 5, the USB connector 11 is inserted into the receptacle 80 provided in the host, for example. The receptacle 80 is an example of an external device. The USB connector 11 can be inserted into the receptacle 80 in a direction substantially along the Y-axis.

The receptacle 80 is mounted on a circuit board of the host, for example. However, the receptacle 80 may be mounted on another device or component, such as a hub, connected to the host. The receptacle 80 includes a connection part 81 and a guide part 82.

The connection part 81 includes an attachment portion 84 and an extension portion 85. The attachment portion 84 is attached to the circuit board of the host. The extension portion 85 is formed in a plate shape, and is extended from the attachment portion 84 in the direction along the Y-axis. The attachment portion 84 and the extension portion 85 are made of a synthetic resin, for example. Inside the attachment portion 84 and the extension portion 85, a conductor is disposed to connect a device, such as the USB drive 10, to the host.

The guide part 82 is formed as a cylinder having a substantially rectangular shape and extending in the direction along the Y-axis. The guide part 82 surrounds the extension portion 85 of the connection part 81, and forms an insertion port 87. The extension portion 85 is arranged inside the insertion port 87.

The receptacle 80 further includes an outer edge portion 91 and a bottom face 92. The outer edge portion 91 is an end portion of the receptacle 80 in the direction along the Y-axis. The outer edge portion 91 is formed by a portion of the guide part 62, for example. The bottom face 92 is an end portion of the insertion port 87 in the direction along the Y-axis. In other words, the outer edge portion 91 is positioned at one end portion of the insertion port 87 in the direction along the Y-axis, and the bottom face 92 positioned at the other end portion of the insertion port 87 in the direction along the Y-axis.

The receptacle 80 further includes a plurality of contact terminals 94. The contact terminals 94 respectively protrude from the extension portion 85 of the connection part 81 in directions along the Z-axis. In other words, the contact terminals 94 protrude from the extension portion 85 toward the inner face of the guide part 82. The contact terminals 94 are supported by the extension portion 85 such that they are elastically movable in the direction along the axis.

According to the USB 3.0 standard, the length L2 between the outer edge portion 91 and the bottom face 92 in the direction along the Y-axis is prescribed as 10.15 to 10.50 mm. Further, the length L3 between the outer edge portion 91 and the central position of each contact terminal 94 in the direction along the Y-axis is prescribed as 4.50±0.15 mm.

The USB connector 11 of the USB drive 10 is inserted into the insertion port 87 of the receptacle 80. The terminals 41 of the USB connector 11 are brought into contact with the contact terminals 94 of the receptacle 80. Consequently, the USB drive 10 and the receptacle 80 are electrically connected to each other, and the USB drive 10 is thereby connected to the host.

As shown in FIG. 3, the length L4 of each terminal 41 in the direction along the X-axis is substantially the same as the length L5 of each contact terminal 94 in the direction along the X-axis. However, the length L4 and the length L5 may be set different from each other. Each of the length L4 and the length L5 is 1.0 mm, for example.

As described above, the USB drive 10 is inserted into the receptacle 80 provided in the host. As shown in FIG. 3, in a state where the USB drive 10 has been inserted into the receptacle 80, there is a case that the relative positions of the USB drive 10 and receptacle 80 are deviated from the desired positions. FIG. 3 shows a contact terminal 94 at the desired position by use of two-dot chain lines, and shows the contact terminal 94 at a deviated position by use of solid lines. In this case, the contact terminal 94 may ride onto the first solder resist 23 of the USB drive 10.

However, as shown in FIG. 4, in the USB drive 10 according to the first embodiment, the distance D2 between the first edge portion 63 and the corresponding terminal 41 (for example, the ground terminal 41A) in the direction along the Y-axis is smaller than the distance D1 between the third edge portion 65 and this terminal 41 in the direction along the X-axis. In other words, the distance D1 between the edge (third edge portion 65) of the first solder resist 23 and the corresponding terminal 41 in the widthwise direction is set larger than the distance D2 between the edge (first edge portion 63) of the first solder resist 23 and this terminal 41 in the lengthwise direction. Consequently, even if the positions of the respective terminals 41 of the USB drive 10 are deviated in the widthwise direction from the positions of the contact terminals 94 to be electrically connected to the terminals 41, the contact terminals 94 can more reliably come into contact with the respective terminals 41 without riding onto the first solder resist 23. In this respect, even if the positions of the respective terminals 41 of the USB drive 10 are deviated in the lengthwise direction from the positions of the contact terminals 94, the contact terminals 94 can more reliably come into contact with the respective terminals 41 of the USB drive 10, as compared with a case that they are deviated in the widthwise direction. Further, as compared with a case that each terminal 41 is formed up to near the third edge portion in the widthwise direction, the dimension of each terminal 41 in the widthwise direction can be set smaller. Consequently, it is possible to suppress an increase in the material cost of the terminals 41, and to suppress an increase in the manufacturing cost of the USB drive 10.

The USB drive 10 can be inserted into the receptacle 80 in the direction along the Y-axis, in which the terminals 41 is extended. Thus, the distance D1 between the edge (third edge portion 65) of the first solder resist 23 and the corresponding terminal 41 in the widthwise direction perpendicular to the insertion direction is set larger than the distance D2 between the edge (first edge portion 63) of the first solder resist 23 and this terminal 41 in the insertion direction. Consequently, even if the positions of the respective terminals 41 are deviated in the width direction from the positions of the contact terminals 94 when the USB drive 10 is inserted, the contact terminals 94 can more reliably come into contact with the respective terminals 41 without riding onto the first solder resist 23.

In the thickness direction of the substrate the distance D3 between the surface of the first solder resist 23 and the first main surface 31 of the substrate 21 is larger than the distance D4 between the surface of each terminal 41 and the first main surface 31. Consequently, it is suppressed that each contact terminal 94 comes into contact with, e.g., the ground terminal 41A and the adjacent first communication terminal 41B at the same time.

The first conductor layer 22 includes the first ground wirings 43A extended from the ground terminal 41A in the direction along the X-axis. In other words, the first ground wirings 43A extend in directions different from the direction in which the ground terminal 41A is extended. Consequently, it is suppressed that the dimension of the USB drive 10 in the direction along the Y-axis increases.

The second ground wiring 43B is extended from a portion of the ground terminal 41A covered with the first solder resist 23. In other words, the second ground wiring 43B is covered with the first solder resist 23 and is thereby protected. Consequently, it is suppressed that the corresponding contact terminal 94 comes into contact with the second ground wiring 43B, when the USB drive 10 is inserted, for example.

The USB drive 10 includes the USB connector 11 that includes the substrate 21, the first conductor layer 22, and the first solder resist 23. In this USB connector 11, it is beneficial that the contact terminals 94 can more reliably come into contact with the respective terminals 41 without riding onto the first solder resist 23, even if the positions of the respective terminals 41 of the USB drive 10 are deviated in the widthwise direction from the positions of the contact terminals 94.

As shown in FIG. 5, according to the USB 3.0 standard, the length L2 between the outer edge portion 91 of the receptacle 80 and the bottom face 92 of the receptacle 80 is prescribed as 10.15 to 10.50 mm. Further, the length L3 between the outer edge portion 91 the receptacle 80 and the central position of each contact terminal 94 is prescribed as 4.50±0.15 mm. Thus, according to the USB 3.0 standard, the maximum value of the length L6 between the bottom face 92 of the receptacle 80 and the central position of each contact terminal 94 is 6.15 mm. Consequently, when the USB connector 11 is inserted into the receptacle 80 until it is brought into contact with the bottom face 92 of the receptacle 90, the centers of the contact terminals 94 come into contact with the terminals 41, each at a position distant from the front end portion 73 of the USB connector 11 by a length smaller than 6.15 mm. Accordingly, in a case that the receptacle 80 conforms to the USB 3.0 standard, if the distance L1 between the front end portion 73 and the first end portion 65a of the third edge portion 65 is set larger than 6.15 mm, the respective terminals 41 can more reliably come into contact with the contact terminals 94, even when the USB connector 11 is inserted into the receptacle 80 until it is brought into contact with the bottom face 92 of the receptacle 80.

The ground wirings 43 connecting the ground terminal 41A and the ground layers 42 is thicker than the power wirings 44 connecting the power terminal 41D and the controller 56. Consequently, it is suppressed that the USB drive 10 is affected by noises.

The power wirings 44 are extended from the power terminal 41C in a direction of getting away from the ground terminal 41A, the first communication terminal 41B, and the second communication terminal 41C. Consequently, An increase in the density of wirings in an area where the plurality of terminals 41 are disposed is suppressed, and a decrease in the design flexibility of the wirings is suppressed.

The fuse 57 is electrically connected to the power terminal 41D through the first wiring portions 44a of the power wirings 44, and is electrically connected to the controller 56 through the second wiring portion 44b. As described above, the power wirings 44 are extended from the power terminal 41D in the direction of getting away from the ground terminal 41A, the first communication terminal 41B, and the second communication terminal 41C. Consequently, the fuse 57, which is a heat-generating component, is placed at a position distant from the plurality of terminals 41, so that it is suppressed that heat from the fuse 57 affects the terminals 41 and other components.

At least part of the portions of the ground wirings 43 exposed by the corresponding opening 61 is plated. Consequently, it is suppressed that the ground wirings 43 are damaged, even if the corresponding contact terminal 94 comes into contact with the ground wirings 43, when the USB drive 10 is inserted, for example.

Second Embodiment

Next, an explanation will be given of a second embodiment with reference to FIG. 6. It should be noted that, in the explanation on the following plurality of embodiments, constituent elements having the same functions as those of constituent elements previously described are denoted by the same reference symbols of the constituent elements previously described, and their description will be suitably omitted in some cases. Further, a plurality of constituent elements denoted by the same reference symbols are not necessarily the same in all the functions and properties, but may be different in function and/or property appropriate to the respective embodiments.

Figure 6:
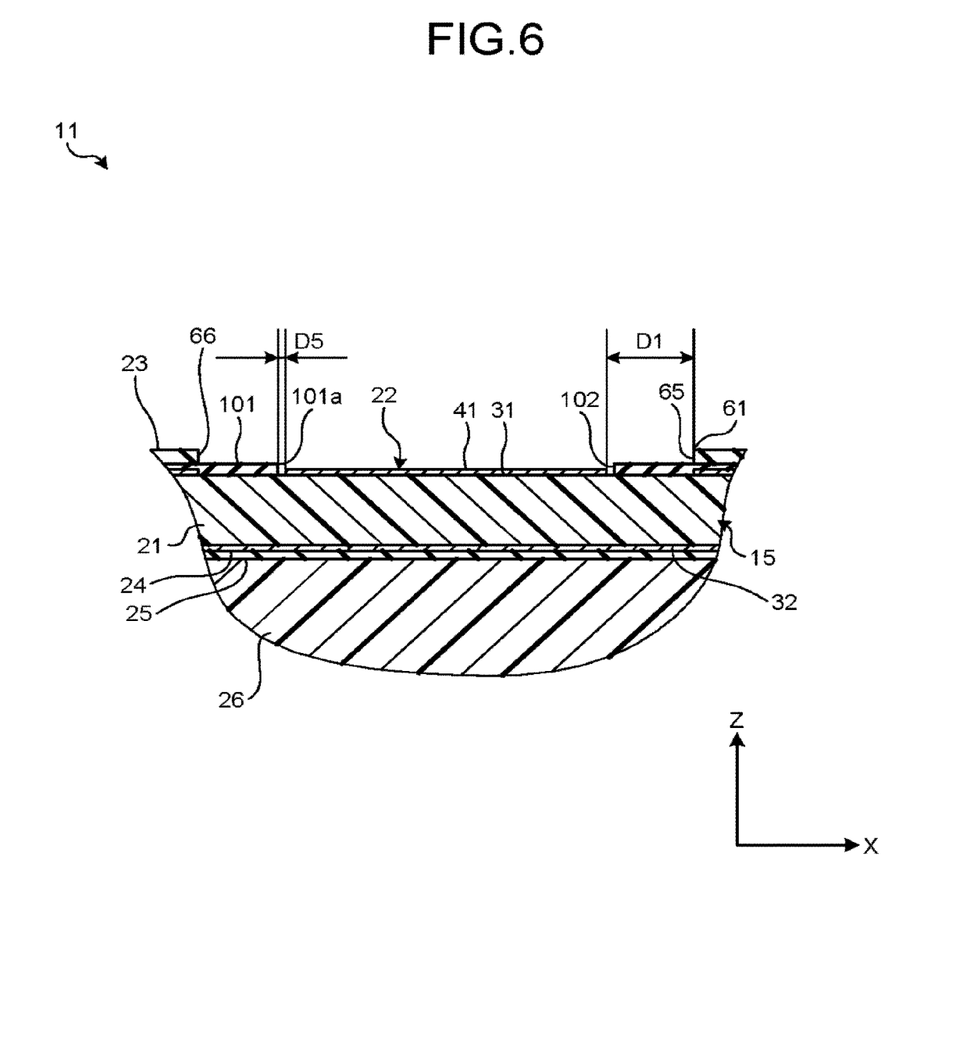
FIG. 6 is a sectional view showing part of a USB connector according to a second embodiment.

FIG. 6 is a sectional view showing part of a USB connector 11 according to the second embodiment, at a position taken along the line F3-F3 of FIG. 2. As shown in FIG. 6, the USB connector 11 further includes a third solder resist 101. The third solder resist 101 is an example of a second insulating layer.

The third solder resist 101 is intermediate between the first conductor layer 22 and the first solder resist 23. The third solder resist 101 covers part of the first conductor layer 22 under the first solder resist 23. In other words, the third solder resist 101 covers part of the first conductor layer 22 and is partly covered with the first solder resist 23. The thickness of the first solder resist 23 is larger than the thickness of the third solder resist 101.

The third solder resist 101 is provided with four small openings 102. Each small opening 102 is an example of a second opening. The four small openings 102 are respectively provided at positions corresponding to the four terminals 41 and four openings 61. Each small opening 102 is formed in a substantially rectangular shape smaller than that of each opening 61.

Each small opening 102 exposes part of the corresponding terminal 41 and part of the first main surface 31 positioned around this terminal 41. However, each small opening 102 may expose the entirety of the corresponding terminal 41.

Each opening 61 surrounds the corresponding small opening 102. Accordingly, each opening 61 exposes not only the corresponding terminal 41 but also part of the third solder resist 101 positioned around the corresponding small opening 102. The third solder resist 101 covers part of the first main surface 31 surrounded by the openings 61. Accordingly, the third solder resist 101 covers part of the ground wirings 43, power wirings 44, first communication wiring 45, and second communication wiring 46 arranged around the terminals 41.

The edge 101a of the third solder resist 101 forming each small opening 102 is separated from the end edge 51 and side edges 53 and 54 of the corresponding terminal 41. The distance D5 between the edge 101a of the third solder resist 101 and the corresponding terminal 41 is smaller than the distance D1 between the third edge portion 65 and this terminal 41.

In the USB drive 10 according to the second embodiment, the third solder resist 101 thinner than the first solder resist 23 is intermediate between the first conductor layer 22 and the first solder resist 23. The distance D5 between the edge 101a of the third solder resist 101 and the corresponding terminal 41 (for example, the ground terminal 41A) is smaller than the distance D1 between the third edge portion 65 and this terminal 41. Thus, for example, the third solder resist 101 can cover and protect at least part of the ground wirings 43 at positions exposed by the openings 61. Consequently, it is suppressed that the corresponding contact terminal 94 of the receptacle 80 comes into contact with the ground wirings 43, when the USB drive 10 is inserted, for example. Further, the first main surface 31 comes to have more part covered with the third solder resist 101, and so the appearance of the USB connector 11 is improved.

Third Embodiment

Figure 7:
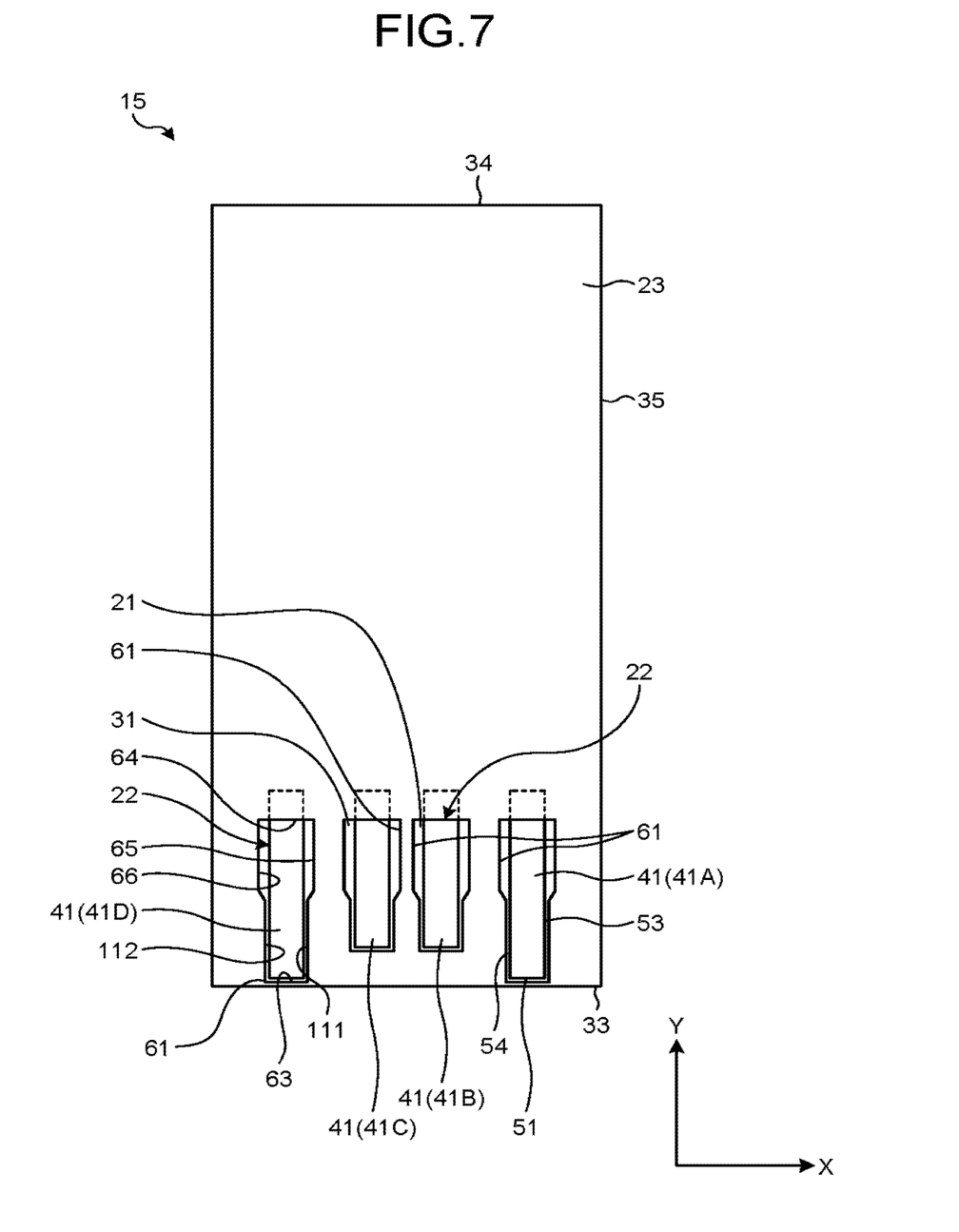
FIG. 7 is a plan view showing a circuit board according to a third embodiment.
Figure 8:
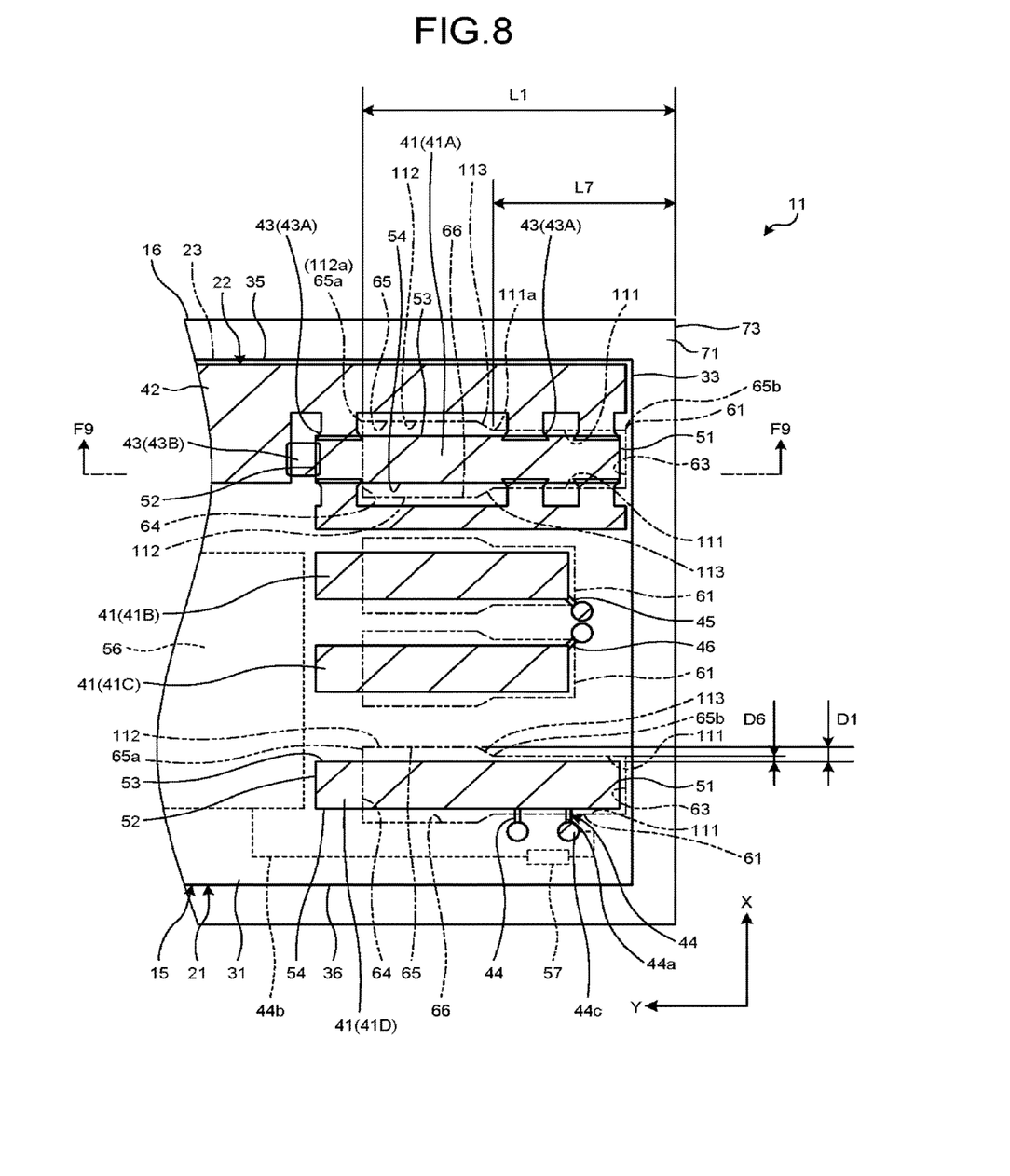
FIG. 8 is a plan view showing part of a USB connector according to the third embodiment.

Next, an explanation will be given of a third embodiment with reference to FIGS. 7 to 9. FIG. 7 is a plan view showing a circuit board 15 according to the third embodiment. FIG. 8 is a plan view showing part of a USB connector 11 according to the third embodiment. FIG. 8 shows the first solder resist 23 by use of two-dot chain lines. In FIG. 8, the first conductor layer 22 is shown with hatching.

As shown in FIG. 8, a third edge portion 65 according to the third embodiment includes a first part edge 111 and a second part edge 112. The first part edge 111 is an example of a third edge. The second part edge 112 is an example of a fourth edge. The first and second part edges 111 and 112 respectively define portions of each opening 61.

The first and second part edges 111 and 112 are respectively extended in the direction along the Y-axis. The first part edge 111 is continuous to second part edge 112. The first part edge 111 is closer to the first end surface 33 of the substrate 21 than the second part edge 112 is. The first part edge 111 is connected to the first edge portion 63. The second part edge 112 is closer to the second end surface 34 than the first part edge 111 is. The second part edge 112 is connected to the second edge portion 64.

The first and second part edges 111 and 112 are respectively separated from the corresponding terminal 41 in the direction along the X-axis. In other words, a gap is formed between the first part edge 111 and the side edge 53 of the corresponding terminal 41. Further, a gap is formed between the second part edge 112 and the side edge 53 of the corresponding terminal 41. For example, in the directions along the X-axis, the first and second part edges 111 and 112 are respectively separated from the side edge 53 of ground terminal 41A. The first part edge 111 faces the side edge 53, as in the second part edge 112.

As shown in FIG. 8, the distance D6 between the side edge 53 of the corresponding terminal 41 and the first part edge 111 is smaller than the distance D1 between the side edge 53 of the this terminal 41 and the second part edge 112, which is part of the third edge portion 65. For example, the distance D6 is substantially the same as the distance D2 between the end edge 51 of the corresponding terminal 41 and the first edge portion 63 shown in FIG. 4, but the distance D6 may be different from the distance D2.

The third edge portion 65 further includes a third part edge 113. The third part edge 113 is an example of a fifth edge. The third part edge 113 connects the first part edge 111 and the second part edge 112 to each other. The third part edge 113 becomes more separated from the corresponding terminal 41, with an increase in the distance from the first end surface 33. In other words, the third part edge 113 is obliquely extended relative to the Y-axis.

The fourth edge portion 66 also includes the first to third part edges 111 to 113, as in the third edge portion 65. The first part edge 111 of the third edge portion 65 and the first part edge 111 of the fourth edge portion 66 are extended substantially in parallel with each other. The distance between the third part edge 113 of the third edge portion 65 and the third part edge 113 of the fourth edge portion 66 becomes smaller, with a decrease in the distance from the first end surface 33.

Each first ground wiring 43A is extended across the corresponding first part edge 111, when seen in a plan view. Further, each power wiring 44 is extended across the corresponding first part edge 111, when seen in a plan view.

As shown in FIG. 8, the second part edge 112 includes an end portion 112a. The end portion 112a is an end portion of the second part edge 112 in a direction of being more distant from the front end portion 73 of the USB connector 11 in the direction along the Y-axis. The end portion 112a is an example of a first end portion. The end portion 112a of the second part edge 112 is the same portion as the first end portion 65a of the third edge portion 65.

The length L1 between the front end portion 73 of the USB connector 11 and the end portion 112a of the second part edge 112 is larger than 6.15 mm. Further, the length between the front end portion 73 and the end edge 52 of each terminal 41 is larger than the length L1.

The first part edge 111 includes an end portion 111a. The end portion 111a is an end portion of the first part edge 111 in a direction of being more distant from the front end portion 73 of the USB connector 11 in the direction along the Y-axis. The end portion 111a is an example of a second end portion.

The length L7 between the front end portion 73 of the USB connector 11 and the end portion 111a of the first part edge 111 is smaller than 3.90 mm. Further, the distance between the front end portion 73 and the end edge 51 of each terminal 41 is smaller than the length L7.

In the USB drive 10 according to the third embodiment, the third edge portion 65 includes the first part edge 111 and the second part edge 112. The first and second part edges 111 and 112 are respectively separated from the corresponding terminal 41 (for example, the ground terminal 41A) in the direction along the X-axis. Here, the distance D6 between the first part edge 111 and the corresponding terminal 41 is smaller than the distance D1 between the second part edge 112 and this terminal 41. Thus, the part of the first solder resist 23 provided with the first part edge 111 covers and protects the first main surface 31 of the substrate 21 more widely than the part of the first solder resist 23 provided with the second part edge 112 does. Consequently, it is suppressed that the contact terminals 94 comes into contact with the first main surface 31 of the substrate 21, when the USB drive 10 is inserted, for example. Further, the first main surface 31 comes to have more part covered with the first solder resist 23, and so the appearance of the USB connector 11 is improved.

The first part edge 111 is closer to the first end surface 33 than the second part edge 112 is. When the USB drive 10 is inserted, the contact terminals 94 come into contact with the terminals 41 of the USB drive 10, each at a position distant from the first end surface 33, in general. Thus, the portions of the first solder resist 23 provided with the first part edge 111 cover and protect the first main surface 31 of the substrate 21, at the places between the first end surface 33 of the substrate 21 and the contact positions of the contact terminals 94 with the terminals 41, in a state where the USB drive 10 has been inserted. Consequently, it is suppressed that the contact terminals 94 come into contact with the first main surface 31 of the substrate 21, when the USB drive 10 is inserted, for example.

The third edge portion 65 includes the third part edge 113, which connects the first part edge 111 and the second part edge 112 to each other, and becomes more separated from the corresponding terminal 41, with an increase in the distance from the first end surface 33. Consequently, when the USB drive 10 is pulled out from the receptacle 80, each contact terminal 94 is guided by the third part edge 113. Consequently, it is suppressed that the contact terminals 94 are caught in the first solder resist 23 and the contact terminals 94 carve the first solder resist 23.

Each first ground wiring 43A extended across the corresponding first part edge 111, when seen in a plan view. Thus, more part of each first ground wiring 43A is covered with the first solder resist 23 and is thereby protected, as compared with a case that each first ground wiring 43A is extended across the second part edge 112. Consequently, it is suppressed that the corresponding contact terminal 94 comes into contact with the first ground wirings 43A, when the USB connector 11 is inserted, for example. Further, the first ground wirings 43A come to have more part covered with the first solder resist 23, and so the appearance of the USB connector 11 improved.

Figure 9:
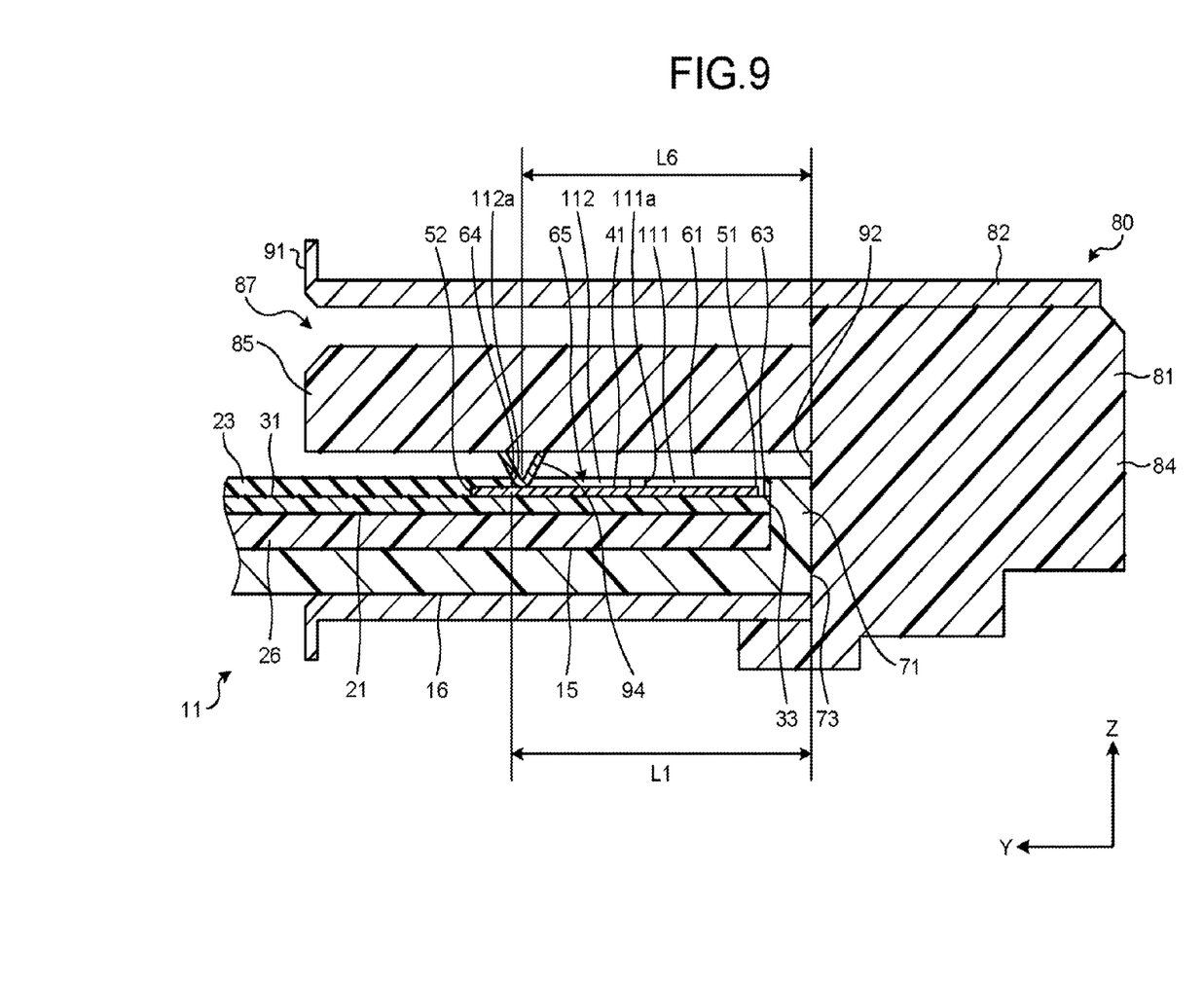
FIG. 9 is a sectional view showing the USB connector and a receptacle according to the third embodiment.

FIG. 9 is a sectional view showing the USB connector 11 and the receptacle 80 according to the third embodiment, at a position taken along a line F9-F9 of FIG. 8. As shown in FIG. 9, according to the USB 3.0 standard, the maximum value of the length L6 between the bottom face 92 of the receptacle 80 and the central position of each contact terminal 94 is 6.15 mm. Consequently, when the USB connector 11 is inserted into the receptacle 80 until it is brought into contact with the bottom face 92 of the receptacle 80, the centers of the contact terminals 94 come into contact with the terminals 41, each at a position distant from the front end portion 73 of the USB connector 11 by a length smaller than 6.15 mm. Accordingly, in a case that the receptacle 80 conforms to the USB 3.0 standard, if the length L1 between the front end portion 73 and the end portion 112a of the second part edge 112 is set larger than 6.15 mm, the respective terminals 41 can more reliably come into contact with the contact terminals 94, even when the USB connector 11 is inserted into the receptacle 80 until it is brought into contact with the bottom face 92 of the receptacle 80.

Fourth Embodiment

Figure 10:
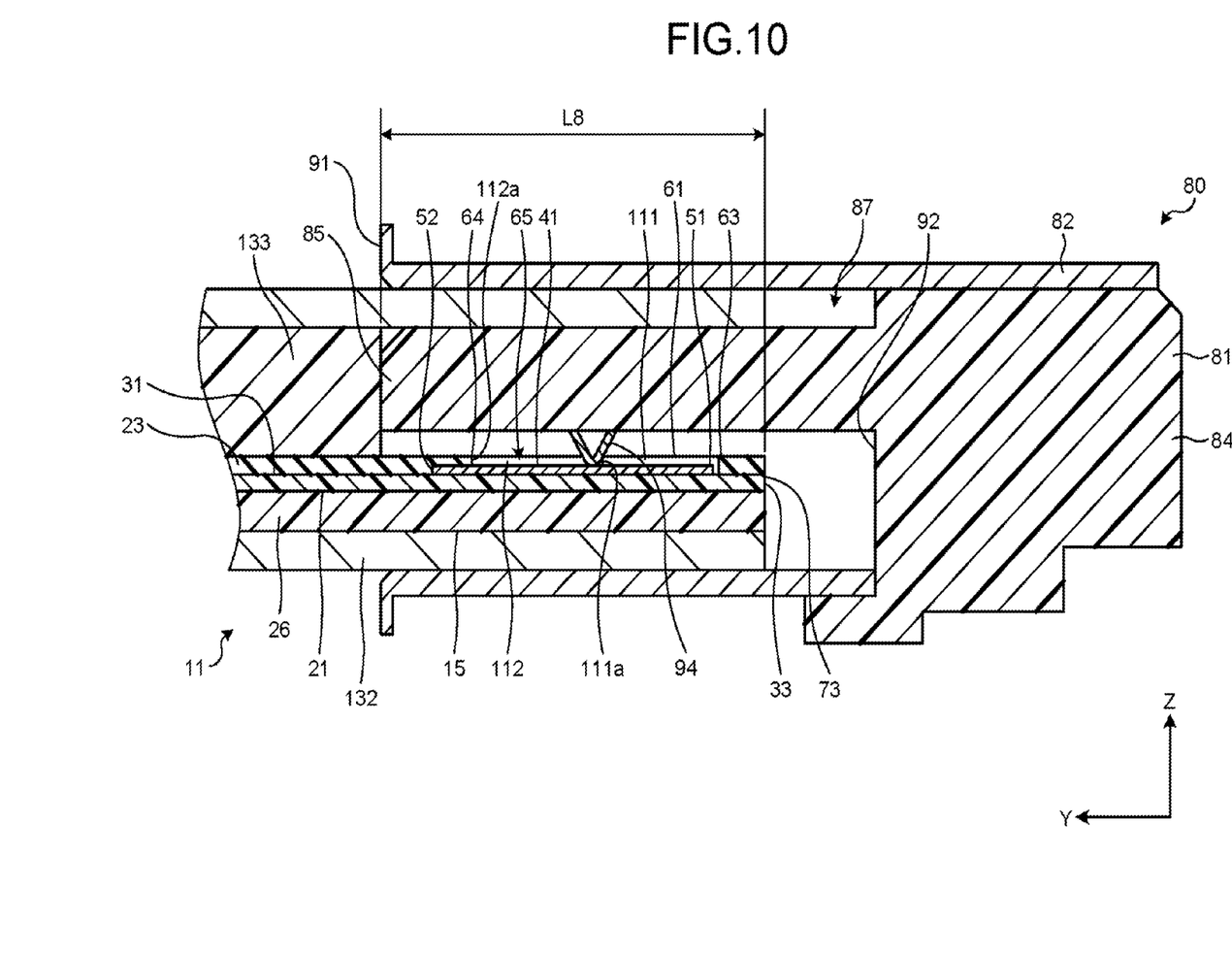
FIG. 10 is a sectional view showing a USB connector and a receptacle according to a fourth embodiment.

Next, an explanation will be given of a fourth embodiment with reference to FIG. 10. FIG. 10 is a sectional view showing a USB connector 11 and the receptacle 80 according to the fourth embodiment. The fourth embodiment employs the same circuit board 15 as the circuit board 15 according to the third embodiment. On the other hand, the USB connector 11 according to the fourth embodiment includes a guide 132 and a stopper 133, in place of the cover 16.

The guide 132 is formed as a cylinder having a substantially rectangular shape. The guide 132 surrounds the circuit board 15 and the reinforcing plate 26. The inner face of the guide 132 is set in contact with the reinforcing plate 26. The guide 132 is formed in a size that can be inserted into the insertion port 87 of the receptacle 80.

The stopper 133 is arranged between the first solder resist 23 of the circuit board 15 and the inner face of the guide 132. The stopper 133 is disposed at a position distant from the front end portion 73 of the USB connector 11 in the direction along the Y-axis.

In the fourth embodiment, the first end surface 33 of the substrate 21 forms the front end portion 73 of the USB connector 11. However, the front end portion 73 is not limited to this example, but may be formed by the reinforcing plate 26 or guide 132, for example.

According to the USB 3.0 standard, the length L8 between the front end portion 73 and the stopper 133 is prescribed as 8.65±0.10 mm. The length L8 is larger than the length L1 between the front end portion 73 and the end portion 112a of the second part edge 112.

When the USB connector 11 is inserted into the insertion port 87 of the receptacle 80, the extension portion 85 of the receptacle 80 comes into contact with the stopper 133 of the USB connector 11. In this way, the stopper 133 limits the length with which the USB connector 11 is inserted into the receptacle 80.

As shown in the fourth embodiment, the USB connector 11 may be provided with the stopper 133. According to the USB 3.0 standard, the distance from the stopper 133 to the front end portion 73 of the USB connector 11 is prescribed as 8.65±0.10 mm. Thus, according to the USB 3.0 standard, the minimum value distance between the front end portion 73 of the USB connector 11 provided with the stopper 133 and the central position of each contact terminal 94 of the receptacle 80 is 3.90 mm. Consequently, when the USB connector 11 is inserted into the receptacle 80 until the stopper 133 is brought into contact with the receptacle 80, the centers of the contact terminals 94 come into contact with the terminals 41, each at a position distant from the front end portion 73 of the USB connector 11 by a length larger than 3.90 mm. Accordingly, in a case that the receptacle 80 conforms to the USB 3.0 standard, if the distance between the front end portion 73 and the end portion 111a of the first part edge 111 is set smaller than 3.90 mm, the respective terminals 41 can more reliably come into contact with the contact terminals 94, even when the USB connector 11 is inserted into the receptacle 80 until the stopper 133 is brought into contact with the receptacle 80.

According to at least one of the embodiments described above, a first opening that exposes a terminal includes a first edge separated from this terminal in a first direction in which this terminal extends, and a second edge separated from this terminal in a second direction perpendicular to the first direction. A distance between the second edge and the terminal is larger than a distance between the first edge and the terminal. Consequently, a terminal of the receptacle can more reliably come into contact with the terminal of a semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate including a main surface and an end surface adjacent to the main surface;
   a conductor layer including a first terminal mounted on the main surface and extended toward the end surface;
   a first insulating layer mounted on the main surface and covering a part of the conductor layer, the first insulating layer including a first opening that exposes at least part of the first terminal;
   an electronic component mounted on the substrate; and
   a USB connector that includes the substrate, the conductor layer, the first insulating layer, and a front end portion in a first direction,
   wherein the first opening includes a first edge separated from the first terminal in the first direction in which the first terminal is extended, and a second edge separated from the first terminal in a second direction perpendicular to the first direction, a distance between the second edge and the first terminal in the second direction being larger than a distance between the first edge and the first terminal in the first direction,
   the first terminal includes a side edge that is extended in the first direction,
   the second edge includes a third edge and a fourth edge that are separated from the first terminal in the second direction and face the side edge,
   the third edge is closer to the end surface than the fourth edge is,
   a distance between the third edge and the first terminal is smaller than a distance between the fourth edge and the first terminal,
   a distance between the front end portion and an end of the third edge in a direction of being more distant from the front end portion in the first direction is smaller than 3.90 mm, and
   the conductor layer includes a second terminal that is extended toward the end surface, a third terminal that is extended toward the end surface, and a wiring that is extended from the second terminal in a direction intersecting with the first direction and connects the second terminal and the electronic component to each other.

2. The semiconductor memory device according to claim 1, wherein the semiconductor memory device is configured to be inserted into an external device in the first direction.

3. The semiconductor memory device according to claim 2, wherein, in a thickness direction of the substrate, a distance between a surface of the first insulating layer and the main surface of the substrate is larger than a distance between a surface of the first terminal and the main surface of the substrate.

4. The semiconductor memory device according to claim 3, wherein
   the conductor layer includes a ground layer, and a first ground wiring extended from the first terminal in a direction intersecting with the first direction, and
   the first ground wiring connects the first terminal and the ground layer to each other.

5. The semiconductor memory device according to claim 4, wherein
the second edge includes a fifth edge that connects the third edge and the fourth edge to each other, and
the fifth edge becomes more separated from the first terminal in the first direction with an increase in a distance from the end surface.

6. The semiconductor memory device according to claim 5, wherein the first ground wiring is extended across the third edge, when seen in a plan view.

7. The semiconductor memory device according to claim 6, wherein
the conductor layer includes a second ground wiring that is extended from part of the first terminal covered with the first insulating layer, and
the second ground wiring connects the ground layer and the first terminal to each other.

8. The semiconductor memory device according to claim 7, wherein
a distance between the front end portion and an end of the fourth edge in a direction of being more distant from the front end portion in the first direction is larger than 6.15 mm.

9. The semiconductor memory device according to claim 8, wherein
the first ground wiring is thicker than the wiring.

10. The semiconductor memory device according to claim 9, further comprising a fuse,
wherein the wiring includes a first wiring portion that electrically connects the second terminal and the fuse to each other, and a second wiring portion that electrically connects the fuse and the electronic component to each other.

11. The semiconductor memory device according to claim 7, further comprising a second insulating layer that covers part of the conductor layer and includes a second opening that exposes the first terminal,
wherein a distance between an edge of the second insulating layer and the first terminal is smaller than a distance between the second edge and the first terminal, the edge forming the second opening.

12. The semiconductor memory device according to claim 7, wherein at least part of a portion of the first ground wiring exposed by the first opening is plated.

* * * * *